US009503114B1

(12) United States Patent
Ali et al.

(10) Patent No.: US 9,503,114 B1
(45) Date of Patent: Nov. 22, 2016

(54) TIME INTERLEAVING STRUCTURE FOR A MULTI-LANE ANALOG-TO-DIGITAL CONVERTER (ADC)

(71) Applicant: Broadcom Corporation, Irvine, CA (US)

(72) Inventors: Tamer Ali, Irvine, CA (US); Ramy Mohamed Yousry Ahmed Elsayed Awad, Irvine, CA (US); Jun Cao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/855,026

(22) Filed: Sep. 15, 2015

Related U.S. Application Data

(60) Provisional application No. 62/198,608, filed on Jul. 29, 2015.

(51) Int. Cl.
*H03M 1/06* (2006.01)
*H03M 1/12* (2006.01)
*H03M 1/36* (2006.01)

(52) U.S. Cl.
CPC ........... *H03M 1/0607* (2013.01); *H03M 1/121* (2013.01); *H03M 1/1245* (2013.01); *H03M 1/36* (2013.01)

(58) Field of Classification Search
CPC ...... H02M 3/07; H02M 1/66; H02M 1/1661; H02M 1/662; H02M 1/747; H02M 1/82; H02M 3/358; H02M 3/50; H02M 3/502; H02M 7/3026; H02M 7/3033; H02M 3/422; H02M 3/454; H02M 3/47; H02M 13/2767; H02M 1/0836; H02M 1/162; H02M 1/52; H02M 1/0607; H02M 1/36; H02M 1/121; H02M 1/1245; H02M 3/30
USPC .......................................... 341/118, 120, 155
See application file for complete search history.

(56) References Cited

U.S. PATENT DOCUMENTS

| | | | | |
|---|---|---|---|---|
| 5,321,403 A * | 6/1994 | Eng, Jr. | ................ | H03M 1/162 341/120 |
| 7,049,994 B2 * | 5/2006 | Tsujita | .................. | H03M 1/066 341/155 |
| 7,394,415 B2 * | 7/2008 | Fuse | .................... | H03M 1/1038 341/120 |
| 7,791,523 B2 * | 9/2010 | Zhuang | ............... | H03M 1/1215 341/155 |
| 7,948,423 B2 * | 5/2011 | Taft | ...................... | H03M 1/0624 341/155 |
| 8,120,520 B2 * | 2/2012 | Jeong | ...................... | H03M 1/46 341/155 |
| 8,760,335 B1 * | 6/2014 | Kappes | .................. | H03M 1/12 341/155 |

* cited by examiner

*Primary Examiner* — Jean B Jeanglaude
(74) *Attorney, Agent, or Firm* — Sterne, Kessler, Goldstein & Fox P.L.L.C.

(57) ABSTRACT

A multi-lane analog to digital converter (ADC) samples an analog input according to multiple phases of a sampling clock. Ideally, the multiple phases of the sampling clock are non-overlapping. The multi-lane ADC includes one or more reset switches to remove any residual samples that can remain after their conversion from an analog signal domain to a digital signal domain. As a result of this removal, the multiple phases of the sampling clock need not to ideally coincide with one other. Rather, some overlap between the multiple phases of the sampling clock can exist while having digital output samples still accurately represent the analog input.

20 Claims, 9 Drawing Sheets

TIME INTERLEAVING STRUCTURE FOR A MULTI-LANE ANALOG-TO-DIGITAL CONVERTER (ADC)

CROSS REFERENCE TO RELATED APPLICATIONS

This application claims the benefit of U.S. Patent Application No. 62/198,608, filed on Jul. 29, 2015, which is incorporated herein by reference in its entirety.

BACKGROUND

Field of Disclosure

The disclosure relates to analog to digital conversion, including compensation for various impairments among multiples lanes of a multi-lane analog-to-digital converter (ADC).

Related Art

Data converters are frequently used in mixed-signal electronic systems. Mixed signal electronic systems include both analog signal domains and digital signal domains. The analog signal domains primarily operate upon analog signals while the digital signal domains primarily operate upon digital signals. A mechanism is required to transport signals from one domain, such as the analog signal domain, to another domain, such as the digital signal domain. Commonly, an analog-to-digital converter (ADC) is used to convert analog signals from the analog signal domain to digital signals for the digital signal domain.

A conventional multi-lane ADC utilizes multiple phases of a sampling clock to sample analog signals at different instances in time, converts these samples from the analog signal domain to the digital signal domain, and recombines these digital samples to produce digital signals. Typically, the conventional multi-lane ADC includes multiple ADCs, also referred to a multiple lanes, to sample and convert the analog signals from the analog signal domain to the digital signal domain. The multiple ADC collectively sample the analog signals, staggered in time.

However, impairments within the conventional multi-lane ADC may cause impairments, such as amplitude offsets, direct current (DC) offsets, and/or phase offsets to provide some examples, within various signals of the conventional multi-lane that can cause the digital signals to no longer accurately represent the analog signals. The impairments may result from unknown offsets between the multiple phases of the sampling clock, linear imperfections within various lanes from among the multi-lanes of the conventional multi-lane ADC, DC offsets between the various lanes, and/or amplitude offsets between the various lanes, to provide some examples.

BRIEF DESCRIPTION OF THE DRAWINGS/FIGURES

Embodiments of the disclosure are described with reference to the accompanying drawings. In the drawings, like reference numbers indicate identical or functionally similar elements. Additionally, the left most digit(s) of a reference number identifies the drawing in which the reference number first appears.

Figure 1:
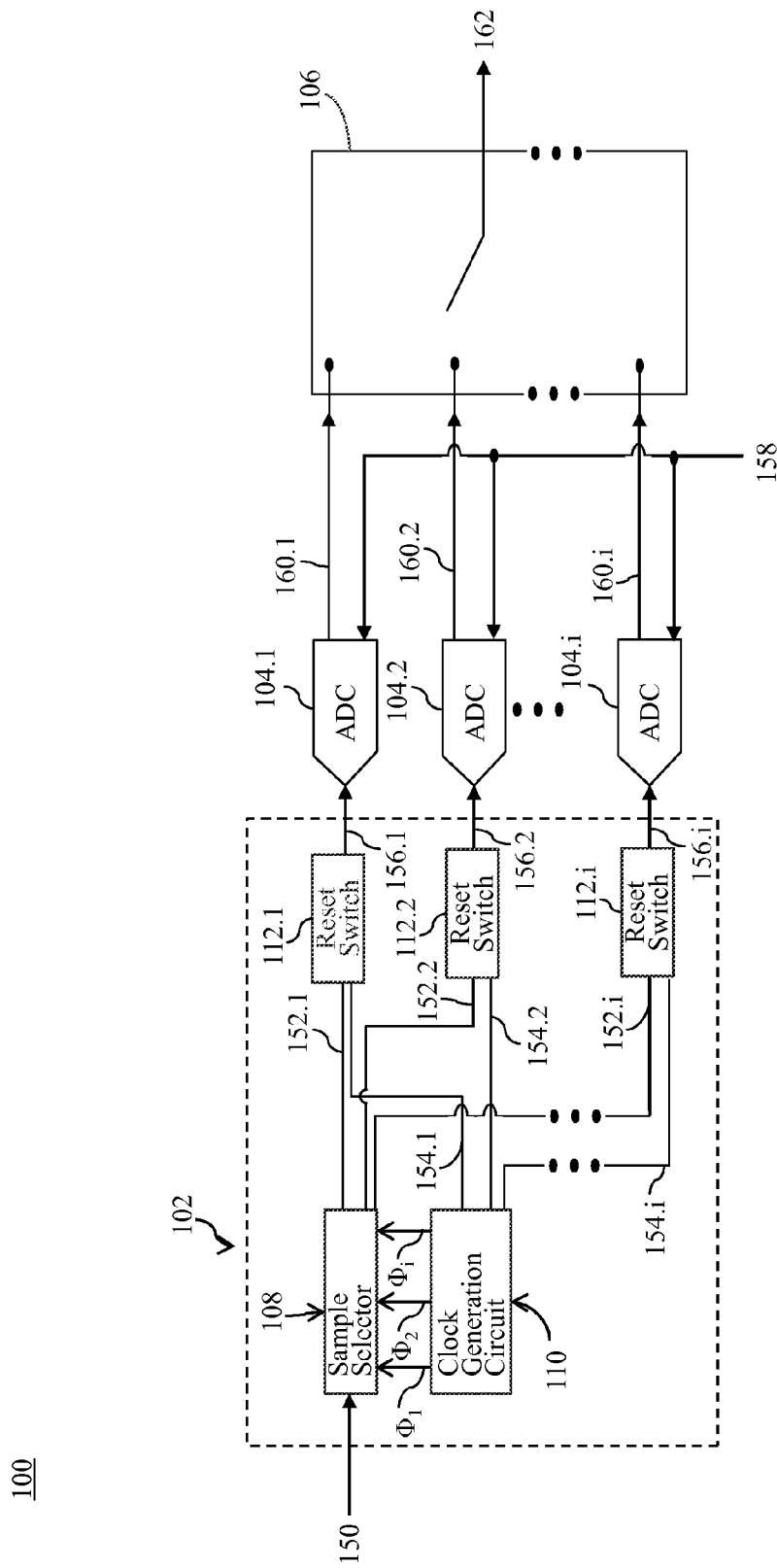
FIG. 1 illustrates a block diagram of a multi-lane analog-to-digital converter (ADC) according to an exemplary embodiment of the present disclosure.

The disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE DISCLOSURE

Overview

The present disclosure outlines a multi-lane analog-to-digital converter (ADC) that converts an analog input from an analog signal domain to a digital signal domain to provide digital output samples. The multi-lane ADC samples the analog input according to multiple phases of a sampling clock. Ideally, the multiple phases of the sampling clock are non-overlapping. The multi-lane ADC includes one or more reset switches to remove any residual samples that can remain after their conversion from the analog signal domain to the digital signal domain. As a result of this removal, the multiple phases of the sampling clock need not ideally coincide with one other. Rather, some overlap between the multiple phases of the sampling clock can be exist while having the digital output samples still accurately represent the analog input.

Exemplary Multi-Lane Analog-to-Digital Converter (ADC)

FIG. 1 illustrates a block diagram of a multi-lane analog-to-digital converter (ADC) according to an exemplary embodiment of the present disclosure. A multi-lane ADC 100 converts an analog input 150 from a first signal domain, such as an analog signal domain to provide an example, to a second signal domain, such as a digital signal domain to provide an example, to provide digital output samples 162. The multi-lane ADC 100 includes an interleaving structure 102, sub-ADCs 104.1 through 104.$i$, and a switching module 106.

As illustrated in FIG. 1, the interleaving structure 102 includes a sample selector 108, a clock generation circuit 110, and reset switches 112.1 through 112.$i$. The sample selector 108 samples the analog input 150 in accordance with multiple phases $\phi 1$ through $\phi i$ of a sampling clock to separate the analog input 150 into selected analog inputs 152.1 through 152.$i$.

The clock generation circuit 110 provides the multiple phases φ1 through φi of the sampling clock and reset signals 154.1 through 154.*i*. Typically, each of the multiple phases φ1 through φi of the sampling clock switches between a first logical value, such as a logical zero to provide an example, and a second logical value, such as a logical one. The sample selector 108 samples the analog input 150 when a corresponding phase from among the multiple phases φ1 through φi of the sampling clock is at the first logical value to provide a corresponding selected analog input from among the selected analog inputs 152.1 through 152.*i*. Additionally, the clock generation circuit 110 provides reset signals 154.1 through 154.*i*. The clock generation circuit 110 asserts a corresponding reset signal from among the reset signals 154.1 through 154.*i* after a corresponding one of the multiple phases φ1 through φi of the transitions between the first logical value and the second logical value and/or de-asserts the corresponding reset signal before the corresponding one of the multiple phases φ1 through φi of the sampling clock transitions between the first logical value and the second logical value. Typically, the assertion of the corresponding reset signal occurs after a transition of a sampling clock of the sub-ADCs 104.1 through 104.*i* between logical values.

The reset switches 112.1 through 112.*i* toggle the selected analog inputs 152.1 through 152.*i* to a first logical value or a second logical value upon assertion of the reset signals 154.1 through 154.*i* to effectively reset the selected analog inputs 152.1 through 152.*i* to a known state or condition to provide sampled analog inputs 156.1 through 156.*i*. This toggling of the selected analog inputs 152.1 through 152.*i* to the first logical value or the second logical value removes any residual samples that can remain on the sampled analog inputs 156.1 through 156.*i* after their conversion from the first signal domain to the second signal domain by the sub-ADCs 104.1 through 104.*i*. As a result of this removal, the multiple phases φ1 through φi of the sampling clock need not ideally coincide with one other. Rather, some overlap between the multiple phases φ1 through φi of the sampling clock can be exist while having the digital output samples 162 still accurately represent the analog input 150. Otherwise, the selected analog inputs 152.1 through 152.*i* pass through the reset switches 112.1 through 112.*i* to provide the sampled analog inputs 156.1 through 156.*i*.

The sub-ADCs 104.1 through 104.*i* convert the sampled analog inputs 156.1 through 156.*i* from the analog signal domain to the digital signal domain in response to a sampling clock 158 to provide the digital output segments 160.1 through 160.*i*. In an exemplary embodiment, the sampling clock 158 can represent multiple phases of the sampling clock 158. In this exemplary embodiment, a corresponding phase from among the multiple phases of the sampling clock 158 is provided to a corresponding sub-ADCs from among the sub-ADCs 104.1 through 104.*i*.

The switching module 106 combines or interleaves the digital output segments 160.1 through 160.*i* to produce the digital output samples 162. The switching module 106 provides the digital output segment 160.1 as a first sample of the digital output samples 162 after its conversion from the analog input segment 160.1 from the analog signal domain to the digital signal domain by the sub-ADC 104.1. Thereafter, the switching module 106 provides the digital output segment 160.2 as a second sample of the digital output samples 162 after its conversion from the analog input segment 160.2 from the analog signal domain to the digital signal domain by the sub-ADC 104.2. Afterwards, the switching module 106 provides the digital output segment 160.*i* as an ith sample of the digital output samples 162 after its conversion from the analog input segment 160.*i* from the analog signal domain to the digital signal domain by the sub-ADC 104.*i*.

Figure 2:
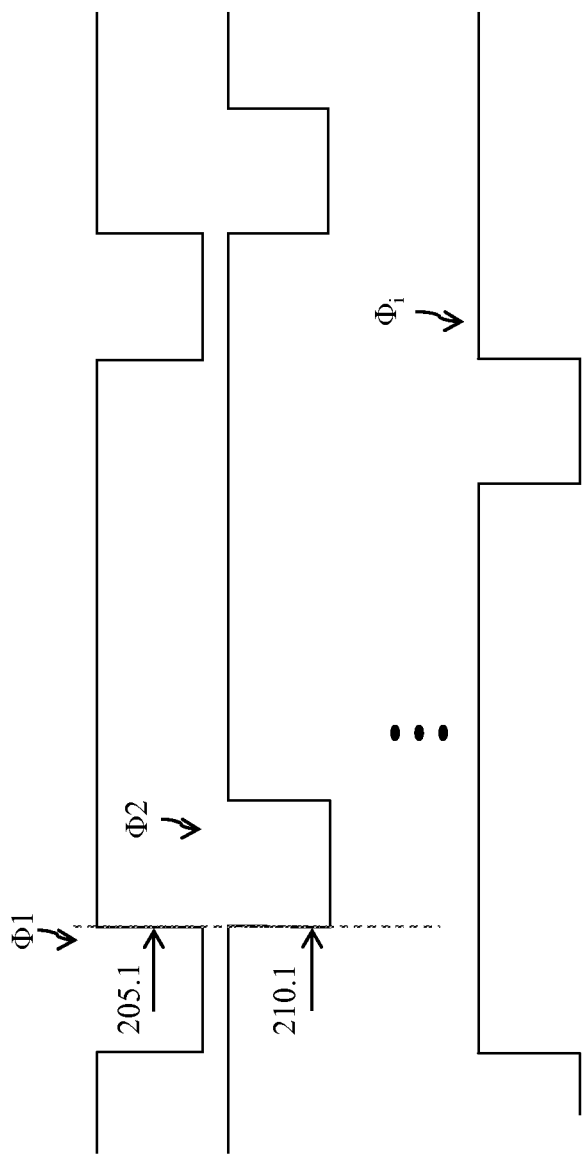
FIG. 2 illustrates an ideal timing diagram of multiple phases of a sampling clock used by the multi-lane ADC.

FIG. 2 illustrates an ideal timing diagram of the phases of interleaving structure 102. The multiple phases φ1 through φi of the sampling clock can be characterized as having a similar frequency, but are offset in phase from each other. The phase offset between adjacent phases from among the multiple phases φ1 through φi of the sampling clock is characterized as being:

$$\frac{2\pi}{i}, \quad (1)$$

where i represents the number of switches of the interleaving structure 102.

Ideally, the multiple phases φ1 through φi of the sampling clock have no overlap between each other such that the digital output samples most accurately represent the analog input. Ideally, a rising edge and a falling edge of consecutive phases are perfectly aligned with one another. For example, as illustrated in FIG. 2, a rising edge 205.1 of phase φ1 of the sampling clock is directly aligned with a falling edge 210.1 of phase φ2 of the sampling clock.

Figure 3:
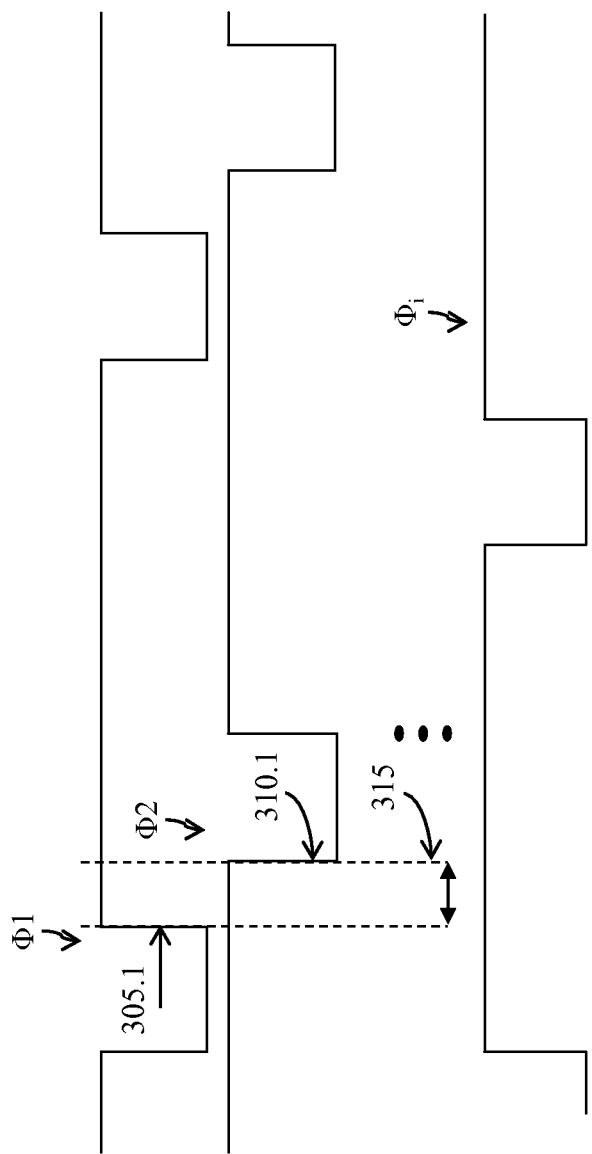
FIG. 3 illustrates a practical ideal timing diagram of the multiple phases of the sampling clock used by the multi-lane ADC.

However, impairments due to mismatches of and leakage between the multiple phases φ1 through φi of the sampling clock can cause an offset, such as an overlap to provide an example, between the multiple phases φ1 through φi of the sampling clock. FIG. 3 illustrates a practical timing diagram of the multiple phases φ1 through φi of the sampling clock. As illustrated in FIG. 3, a rising edge 305.1 of phase φ1 of the sampling clock is offset from a falling edge 310.1 of phase φ2 of the sampling clock by a timing offset 315. As a result of this timing offset 315, the digital output samples 162 no longer accurately represent the analog input 150. For example, the timing offset 315 can cause residual samples to remain on the sampled analog inputs 156.1 through 156.*i* after their conversion from the first signal domain to the second signal domain by the sub-ADCs 104.1 through 104.*i*. As illustrated in FIG. 1, the multi-lane ADC 100 includes the reset switches 112.1 through 112.*i* to toggle the selected analog inputs 152.1 through 152.*i* to effectively reset the selected analog inputs 152.1 through 152.*i* to the known state or condition. The resetting of the selected analog inputs 152.1 through 152.*i* effectively removes any residual samples that can reside on the sampled analog inputs 156.1 through 156.*i*. By removing this residual samples, the digital output samples 162 more accurately represent the analog input 150.

Exemplary Sample Selector

Figure 4:
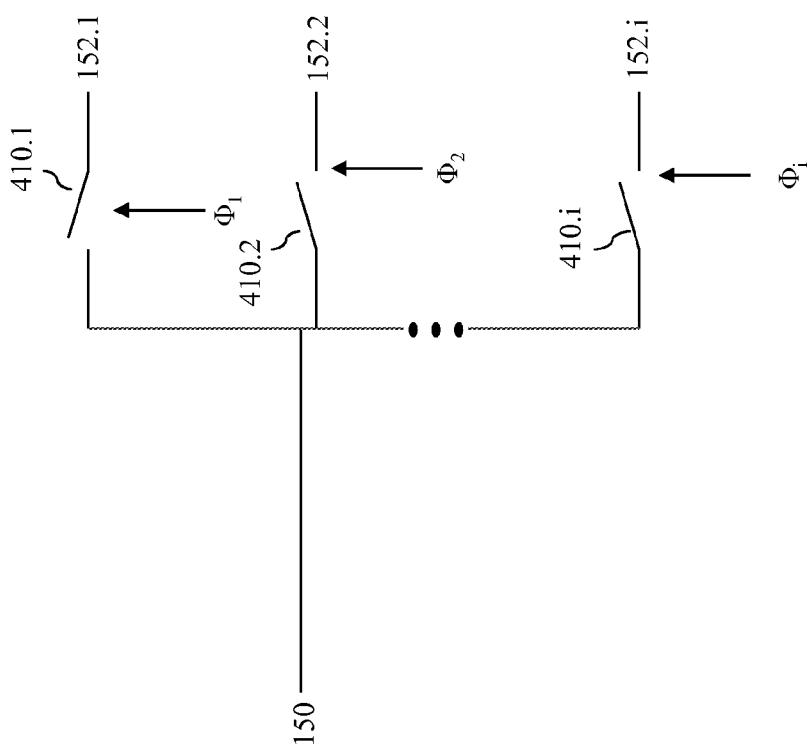
FIG. 4 illustrates a block diagram of a sample selector that can be implemented as part of the multi-lane ADC according to an exemplary embodiment of the present disclosure.

FIG. 4 illustrates a block diagram of a sample selector that can be implemented as part of the multi-lane ADC according to an exemplary embodiment of the present disclosure. A sample selector 408 can represent an exemplary embodiment of the sample selector 108. The sample selector 408 includes switches 410.1 through 410.*i* to sample the analog input 150 to provide the selected analog inputs 152.1 through 152.*i*. The switches 410.1 through 410.*i* can be implemented using bipolar junction transistors (BJTs), field-effect transistors (FETs), and/or any other suitable transistor that will be apparent to those skilled in the relevant disclosure without departing from the spirit and scope of the present disclosure.

As illustrated in FIG. 4, the switches 410.1 through 410.*i* open and/or close in response to the multiple phases φ1 through ϕi of the sampling clock. In an exemplary embodiment, the switches 410.1 through 410.i include eight switches 410.1 through 410.8. When a corresponding one of the multiple phases ϕ1 through ϕi of the sampling clock is at a first logical value, such as a logical zero to provide an example, its corresponding switch from among the switches 410.1 through 410.i is closed thereby effectively sampling the analog input 150 to provide a corresponding selected analog input from among the selected analog inputs 152.1 through 152.i. Otherwise, the corresponding one of the multiple phases ϕ1 through ϕi of the sampling clock is open when the corresponding one of the multiple phases ϕ1 through ϕi of the sampling clock is at a second logical value.

Exemplary Clock Generation Circuit

Figure 5:
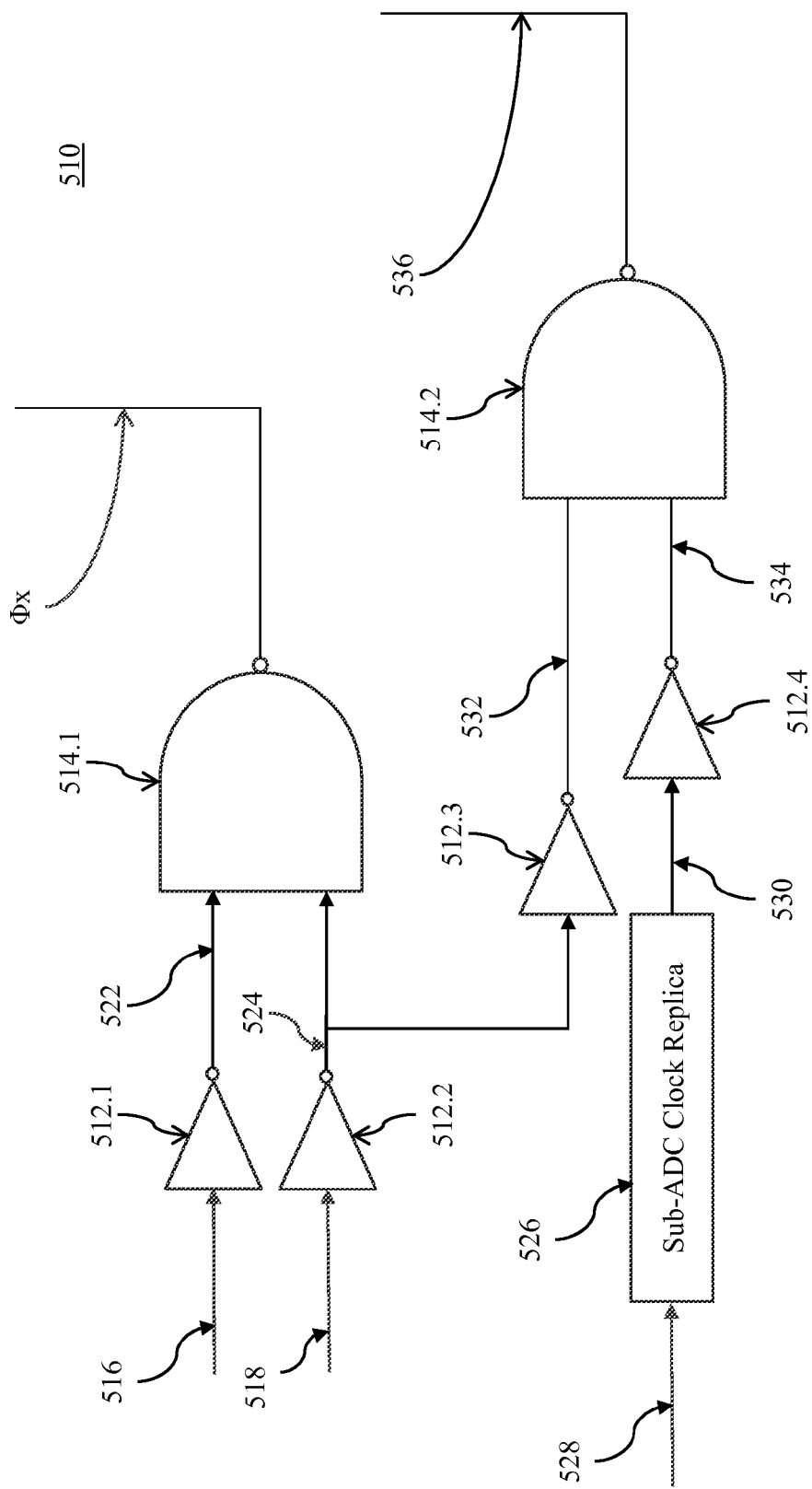
FIG. 5 illustrates a block diagram of a clock generation circuit that can be implemented as part of the multi-lane ADC according to an exemplary embodiment of the present disclosure.

FIG. 5 illustrates a block diagram of a clock generation circuit that can be implemented as part of the multi-lane ADC according to an exemplary embodiment of the present disclosure. Typically, the multi-lane ADC includes multiple clock generation circuits 510 to provide the multiple phases ϕ1 through ϕi of the sampling clock and the reset signals 154.1 through 154.i. These multiple clock generation circuits 510 can represent an exemplary embodiment of the clock generation circuit 110. A clock generation circuit 500 represents an exemplary embodiment of one or more of these multiple clock generation circuits.

The clock generation circuit 510 includes logical inverting gates 512.1 through 512.4, logical NAND gates 514.1-514.2, and a sub-ADC clock replica 526. As illustrated in FIG. 5, the logical inverting gate 512.1 and the logical inverting gate 512.2 receive a first clocking signal 516 and a second clocking signal 518, respectively. The first clocking signal 516 represents a first phase of a clocking signal and the second clocking signal 518 represents a second phase of the clocking signal. In an exemplary embodiment, the multi-lane ADC can include clocking circuitry, such as a multiple phase divider to phase locked loop (PLL) to provide an example, to provide multiple phases of the clocking signal. The first phase and the second phase of the clocking signal represent a corresponding first phase and a corresponding second phase, respectively, of the clocking signal. The corresponding first phase and the corresponding second phase are typically offset from each other, such as approximately 135 degrees to provide an example.

Typically, a sampling mechanism, such as the sample selector 108 to provide an example, of the multi-lane ADC samples an analog input, such as the analog input 150, at the falling edge and holds this sampled data until the rising edge. The logical inverting gate 512.1 and the logical inverting gate 512.2 perform a logical inverting operation upon the first clocking signal 516 to provide an inverted first clocking signal 522 and the second clocking signal 518 to provide an inverted second clocking signal 524, respectively.

The logical NAND gate 514.1 performs a logical NAND operation between the inverted first clocking signal 522 and the inverted second clocking signal 524 to provide an output phase ϕx of the sampling clock. In an exemplary embodiment, the first clocking signal 516 can represent a rising edge of the output phase ϕx of the sampling clock and the second clocking signal 518 can represent a falling edge of the output phase ϕx of the sampling clock. Thus, the logical NAND operation between the inverted first clocking signal 522 and the inverted second clocking signal 524 can be used to provide the output phase ϕx of the sampling clock.

The ADC clock replica 526 delays a sampling clock 528 to provide a delayed sampling clock 530. Typically, the sampling clock 528 represents a sampling clock, such as the sampling clock 158 to provide an example, or a corresponding one of the phases of the sample clock, that is used by sub-ADCs of the multi-lane ADC to convert its corresponding analog input from the analog signal domain to the digital signal domain. This delay provided by the ADC clock replica 526 should be of sufficient duration to allow, on average, a corresponding sub-ADCs from among the sub-ADCs to convert its corresponding analog input.

The logical inverting gate 512.3 and the logical inverting gate 512.4 receive the inverted second clocking signal 524 and the delayed sampling clock 530, respectively. The logical inverting gate 512.3 and the logical inverting gate 512.4 perform a logical inverting operation upon the inverted second clocking signal 524 to provide a second clocking signal 532, representative of the second clocking signal 518, a delayed sampling clock 534, respectively.

The logical NAND gate 514.2 performs a logical NAND operation between the second clocking signal 532 and the delayed sampling clock 534 to provide a reset signal 536. The reset signal 536 can represent an exemplary embodiment of one or more of the reset signals 154.1 through 154.i. The logical NAND gate 514.2 can assert the reset signal 536 during the falling edge of the output phase ϕx of the sampling clock and/or de-asserts the reset signal 536 before the sampling clock 528 transitions between logical values. Thus, the logical NAND operation between the second clocking signal 532 and the delayed sampling clock 534 can be used to provide the reset signal 536.

It should be noted that FIG. 5 illustrates one exemplary logical circuit for providing the output phase ϕx and the reset signal 536. Those skilled in the relevant art(s) will recognize that other logical circuits can be implemented to provide the output phase ϕx and the reset signal 536 from the first clocking signal 516, the second clocking signal 518, and the sampling clock 528 without departing from the spirit and scope of the present disclosure.

Exemplary Reset Switch

Figure 6:
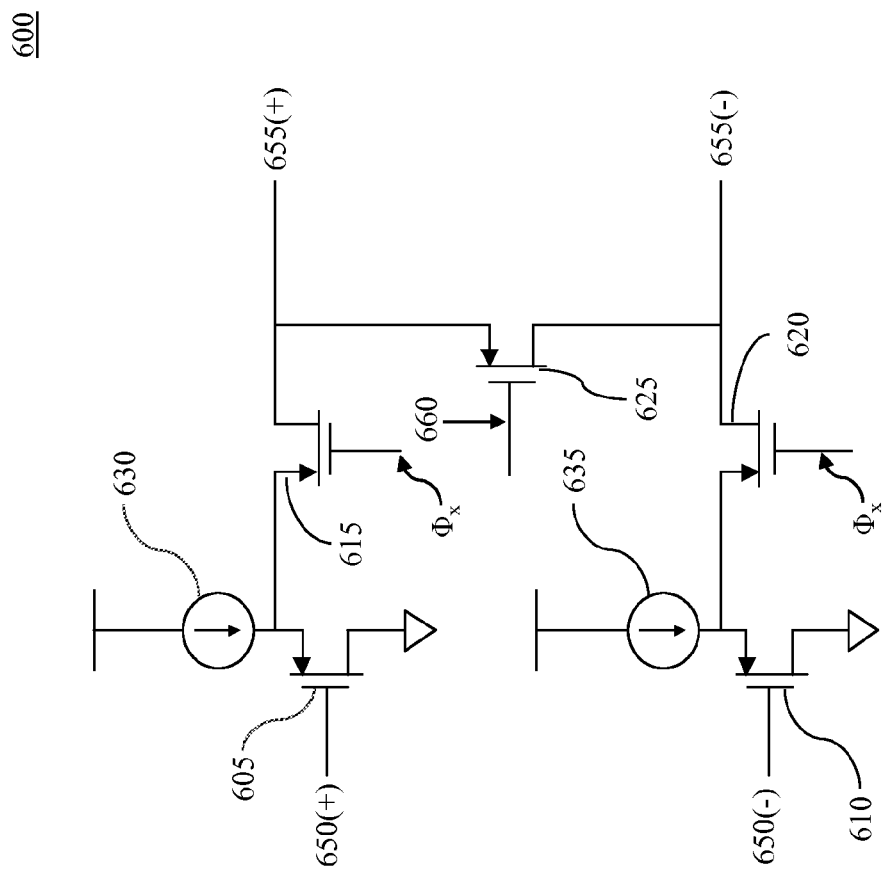
FIG. 6 illustrates a block diagram of a reset switch that can be implemented as part of the multi-lane ADC according to an exemplary embodiment of the present disclosure.

FIG. 6 illustrates a block diagram of a reset switch that can be implemented as part of the multi-lane ADC according to an exemplary embodiment of the present disclosure. As illustrated in FIG. 1, the multi-lane ADC 100 includes the reset switches 112.1 through 112.i. A reset switch 600 represents an exemplary embodiment of one or more of the reset switches 112.1 through 112.i. As illustrated in FIG. 6, the reset switch 600 includes a first transistor 605, a second transistor 610, a third transistor 615, a fourth transistor 620, a fifth transistor 625, a first current source 630 and a second current source 635.

The reset switch 600 receives differential analog inputs 650(+), 650(−) at the first transistor 605 and the second transistor 610, respectively. The differential analog inputs 650(+), 650(−) can represent an exemplary embodiment of one of the selected analog inputs 152.1 through 152.i. When the differential analog inputs 650(+), 650(−) are greater than or equal to a threshold voltage of the first transistor 605 and the second transistor 610, respectively, the first transistor 605 and the second transistor 610 are in a conducting mode of operation. In the conducting mode of operation, the first transistor 605 and the second transistor 610 pass a first current provided by the first current source 630 and a second current provided by the second current source 635, respectively. The first current and the second current flow through the first transistor 605 and the second transistor 610, respectively, to a ground. Otherwise, when the differential analog inputs 650(+), 650(−) are less than the threshold voltage of the first transistor 605 and the second transistor 610, respectively, the first transistor 605 and the second transistor 610 are in a non-conducting mode of operation. In the non-conducting mode of operation, the first current and the second current flow pass onto the third transistor 615 and the fourth transistor 620, respectively.

In addition to the first current and the second current, the third transistor 615 and the fourth transistor 620 receive a phase φX of the sampling clock. The phase φX of the sampling clock corresponds to one of the multiple phases φ1 through φi of the sampling clock. When the phase φX of the sampling clock is greater than or equal to a threshold voltage of the third transistor 615 and the fourth transistor 620, respectively, the third transistor 615 and the fourth transistor 620 are in a conducting mode of operation. In the conducting mode of operation, the third transistor 615 and the fourth transistor 620 pass the first current and the second current, respectively, to provide differential sampled analog inputs 655(+), 655(−). The differential sampled analog inputs 655(+), 655(−) represent one of the sampled analog inputs 156.1 through 156.i. Otherwise, when the phase φX of the sampling clock is less than the threshold voltage of the third transistor 615 and the fourth transistor 620, respectively, the third transistor 615 and the fourth transistor 620 are in a non-conducting mode of operation. In the non-conducting mode of operation, the first current and the second current flow do not pass through the third transistor 615 and the fourth transistor 620, respectively.

However, when a reset signal 660 is asserted, namely greater than or equal to a threshold of the fifth transistor 625, the fifth transistor 625 is in a conducting mode of operation coupling the differential sampled analog inputs 655(+), 655(−). The reset signal 660 can represent an exemplary embodiment of one of the reset signals 154.1 through 154.i. When in the conducting mode of operation, the fifth transistor 625 combines the first current and the second current effectively negating these currents. Otherwise, when the reset signal 660 is de-asserted, namely less than a threshold of the fifth transistor 625, the fifth transistor 625 is in a non-conducting mode of operation. When the fifth transistor 625 is in the non-conducting mode of operation the third transistor 615 and the fourth transistor 620 continue to provide the differential sampled analog inputs 655(+), 655(−), respectively.

Although the reset switch 600 is shown as a differential reset switch, those skilled in the relevant art(s) can readily modify the reset switch 600 to be single ended without departing from the sprit and scope of the present disclosure. This modification can include removal of the second transistor 610 and the fourth transistor 620 and coupling of the fifth transistor 625 to ground.

Second Exemplary Multi-Lane ADC

Figure 7:
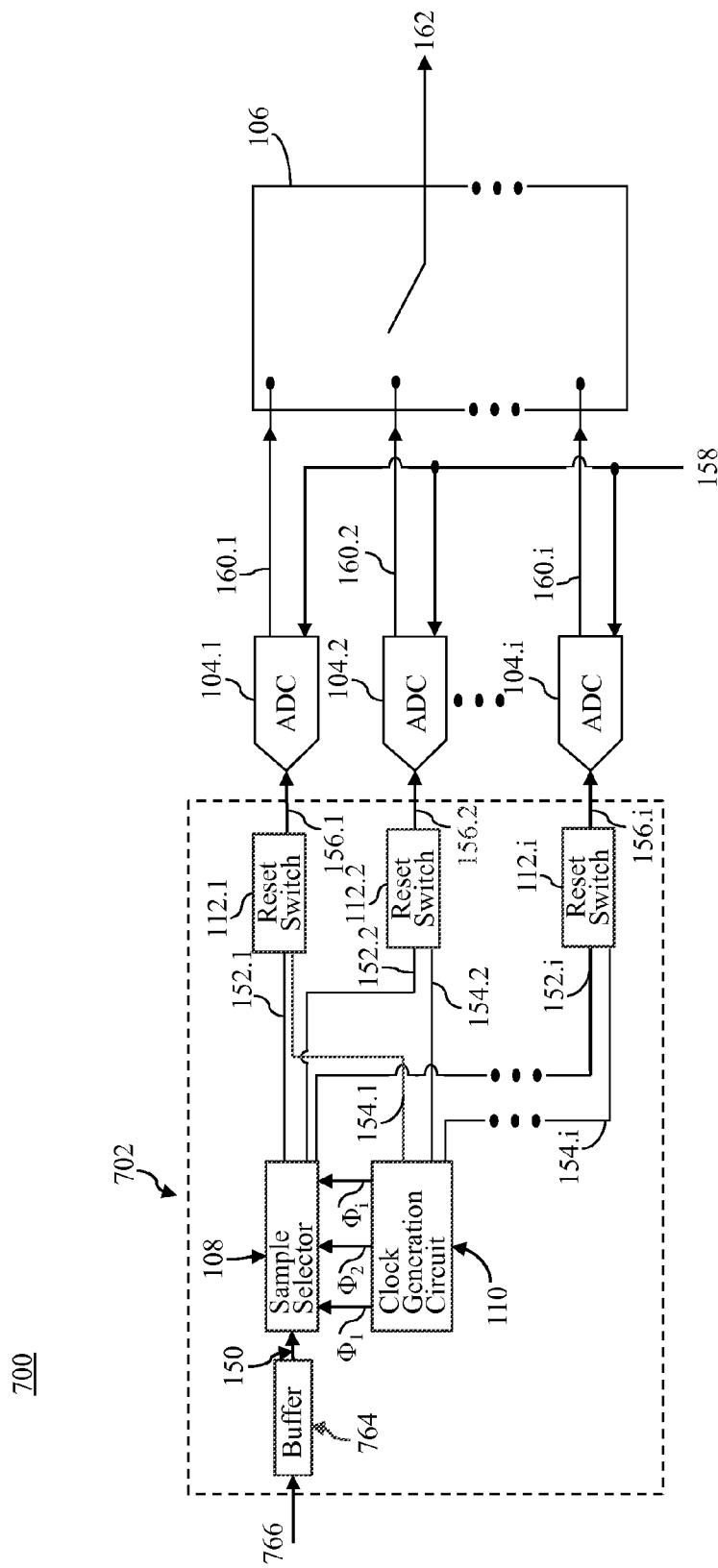
FIG. 7 illustrates a block diagram of a second multi-lane ADC according to an exemplary embodiment of the present disclosure.

FIG. 7 illustrates a block diagram of a second multi-lane ADC according to an exemplary embodiment of the present disclosure. As illustrated in FIG. 7, a multi-lane ADC 700 includes the sub-ADCs 104.1 through 104.i, the switching module 106, and an interleaving structure 702. The interleaving structure 702 shares many substantially similar features to the interleaving structure 102 as described in FIG. 1; therefore, only differences between the interleaving structure 702 and the interleaving structure 102 are to be discussed in further detail. As shown in shown in FIG. 7, the interleaving structure 702 further includes a buffer 764. The buffer 764 amplifies an analog input 766 to provide the analog input 150.

Exemplary Buffer

Figure 8:
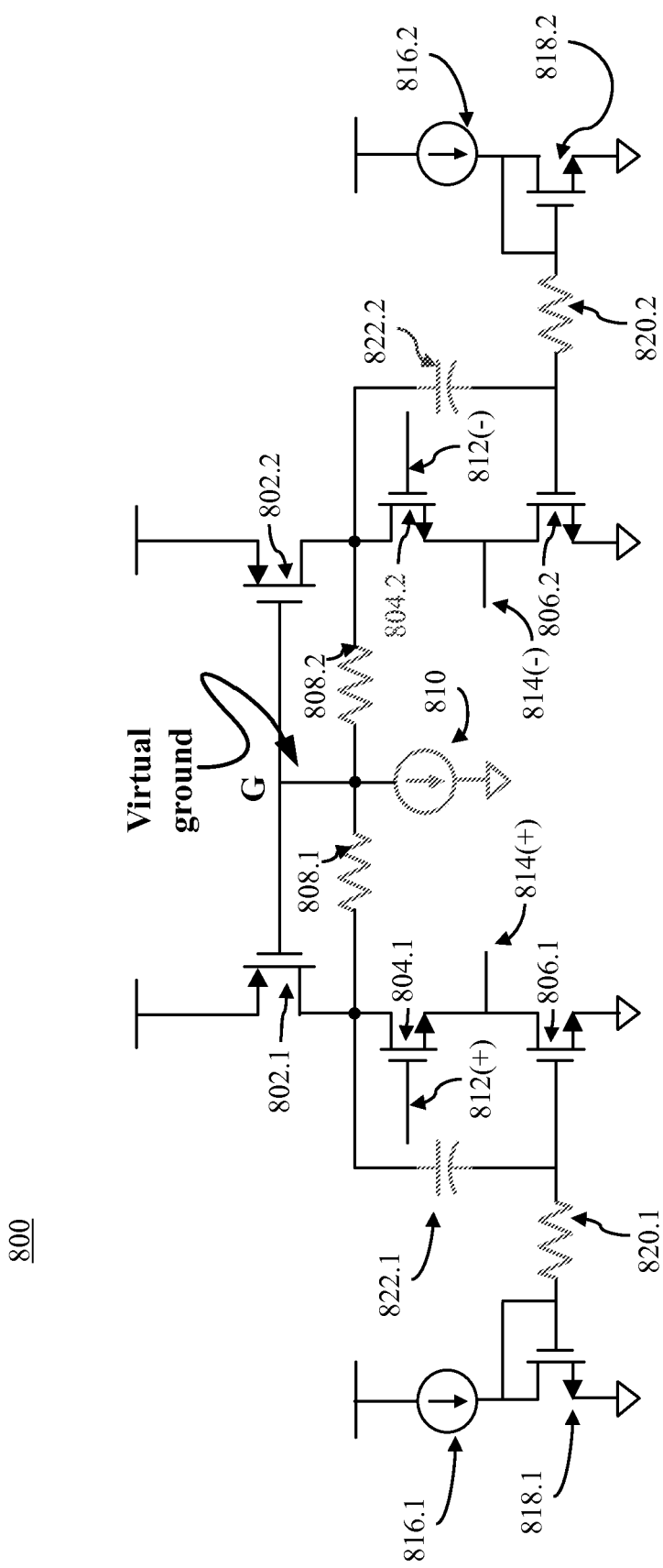
FIG. 8 illustrates a buffer that can be implemented as part of the multi-lane ADC according to an exemplary embodiment of the present disclosure.

FIG. 8 illustrates a buffer that can be implemented as part of the multi-lane ADC according to an exemplary embodiment of the present disclosure. A buffer 800 represents an exemplary embodiment of the buffer 764. As illustrated in FIG. 8, the buffer 800 includes first transistors 802.1/802.2, second transistors 804.1/804.2, third transistors 806.1/806.2, resistors 808.1/808.2, a first current source 810, a second current source 816.1, a third current source 816.2, fourth transistors 818.1/818.2, resistors 820.1/820.2, and a capacitors 822.1/822.2.

The second transistors 804.1/804.2 receives differential analog inputs 812(+), 812(−). The differential analog inputs 812(+), 812(−) can represent an exemplary embodiment of the analog input 150. As illustrated in FIG. 8, the first transistor 802.1, the third transistor 806.1, the resistor 808.1, the second current source 816.1, the fourth transistor 818.1, the resistor 820.1, and the capacitor 822.1 represents a first biasing arrangement for the second transistor 804.1. The first transistor 802.2, the third transistor 806.2, the resistor 808.2, the second current source 816.2, the fourth transistor 818.2, the resistor 820.2, and the capacitor 822.2 represents a second biasing arrangement for the second transistor 804.2. The first biasing arrangement and the second biasing arrangement are coupled to the first current source 810 with a virtual ground G being formed between these biasing arrangements. The first biasing arrangement is substantially similar to the second biasing arrangement; therefore, only the first biasing arrangement is to be discussed in further detail.

When the differential analog input 812(+) is greater than or equal to a threshold voltage of the second transistor 804.1, the second transistor 804.1 is in a conducting mode of operation. In the conducting mode of operation, the second transistor 804.1 passes a current provided by the first transistor 802.1 onto the third transistor 806.1. As illustrated in FIG. 8, the resistor 820.1 provides a substantially equal bias from the second current source 816.1 to the third transistor 806.1 and the fourth transistor 818.1. As a result of this substantially equal bias, the current passing through the second transistor 804.1 is approximately equal to a current provided by the second current source 816.1 to the fourth transistor 818.1. In this situation, the differential analog output 814(+) represents a voltage across the third transistor 806.1. Often times, the second transistor 804.1 amplifies the current provided by the first transistor 802.1 to provide gain to the differential analog output 814(+).

Otherwise, when the differential analog input 812(+) is less than the threshold voltage of the second transistor 804.1, the second transistor 804.1 is in a non-conducting mode of operation. In the non-conducting mode of operation, the current provided by the first transistor 802.1 flows through the resistor 808.1 onto the first current source 810. The current flowing through the resistor 808.1 is approximately equal to a current sourced by the first current source 810. In this situation, voltage the differential analog output 814(+) represents is at a minimum voltage, approximately zero volts. However, in some situations, transients within the first biasing arrangement can cause the differential analog output 814(+) to fluctuate when the second transistor 804.1 is in the non-conducting mode of operation. The first biasing arrangement includes the capacitor 822.1 to effectively reduce these transients.

Third Exemplary Multi-Lane ADC

Figure 9:
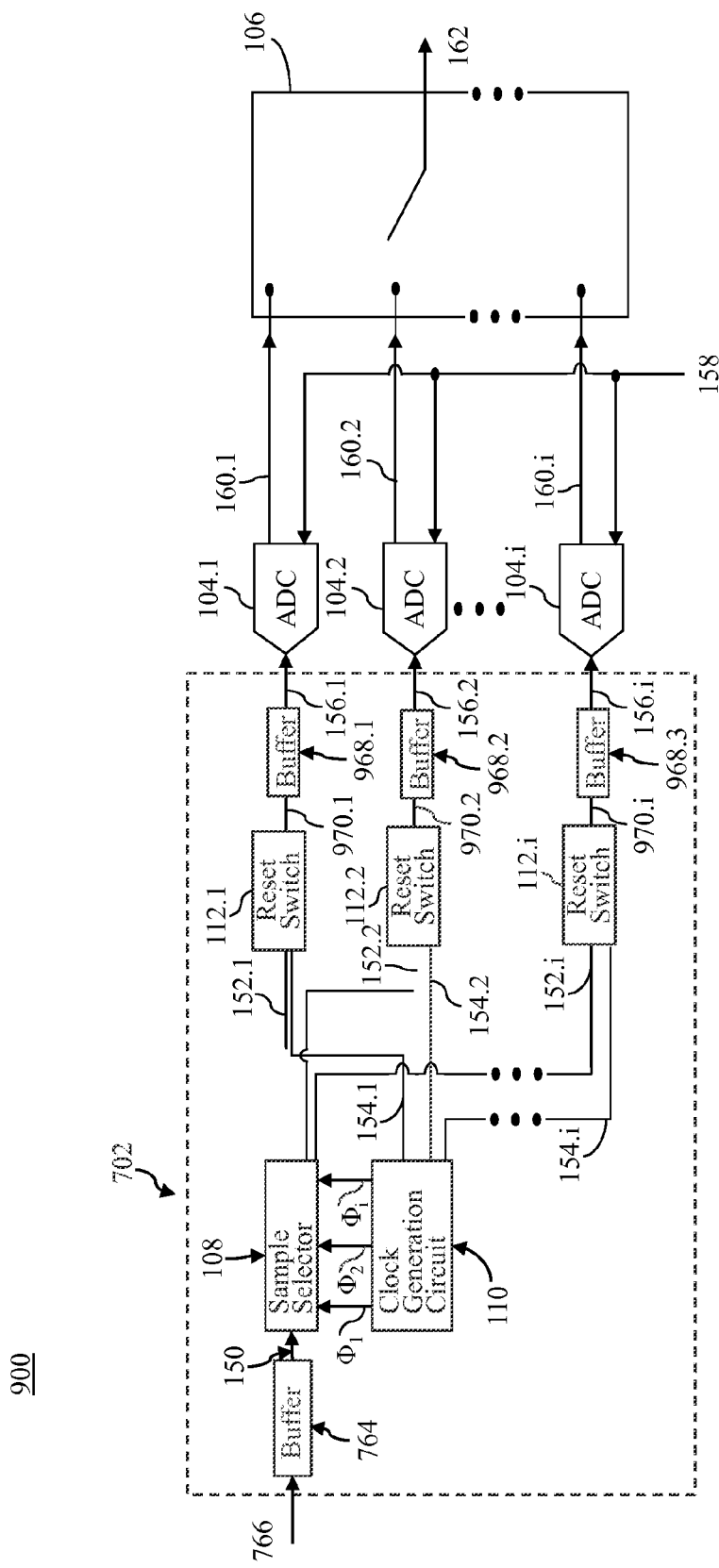
FIG. 9 illustrates a block diagram of a third multi-lane ADC according to an exemplary embodiment of the present disclosure.

FIG. 9 illustrates a block diagram of a third multi-lane ADC according to an exemplary embodiment of the present disclosure. As illustrated in FIG. 9, a multi-lane ADC 900 includes the sub-ADCs 104.1 through 104.i, the switching module 106, the interleaving structure 702, and the buffers 968.1 through 968.i. The multi-lane ADC 900 shares many substantially similar features to the multi-lane ADC 900 as described in FIG. 7; therefore, only differences between the multi-lane ADC 900 and the multi-lane ADC 700 are to be discussed in further detail. As shown in FIG. 9, the buffers 968.1 through 968.i amplify sampled analog inputs 970.1 through 970.i to provide the sampled analog inputs 156.1 through 156.i. One or more of the buffers 968.1 through 968.i can be implemented using the buffer 800.

CONCLUSION

The following Detailed Description referred to accompanying figures to illustrate exemplary embodiments consistent with the disclosure. References in the disclosure to "an exemplary embodiment" indicates that the exemplary embodiment described can include a particular feature, structure, or characteristic, but every exemplary embodiment can not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The exemplary embodiments described within the disclosure have been provided for illustrative purposes, and are not intend to be limiting. Other exemplary embodiments are possible, and modifications can be made to the exemplary embodiments while remaining within the spirit and scope of the disclosure. The disclosure has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

For purposes of this discussion, the term "module" shall be understood to include at least one of software, firmware, and hardware (such as one or more circuits, microchips, or devices, or any combination thereof), and any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

The Detailed Description of the exemplary embodiments fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. An interleaving structure, comprising:
    a sample selector configured to sample an analog input based on multiple phases of a sampling clock to separate the analog input into a plurality of selected analog inputs;
    a clock generation circuit configured to provide the multiple phases of the sampling clock to the sample selector and to generate a plurality of reset signals; and
    a plurality of switches configured to toggle the plurality of selected analog inputs between a first logical value and a second logical value in response to the plurality of reset signals.

2. The interleaving structure of claim 1, wherein each of the multiple phases of the sampling clock switches between the first logical value and the second logical value, and
    wherein the sample selector is further configured to sample the analog input when a corresponding phase from among the multiple phases of the sampling clock is at the second logical value to provide a corresponding selected analog input from among the plurality of selected analog inputs.

3. The interleaving structure of claim 1, wherein the clock generation circuit is further configured to:
    assert a corresponding reset signal from among the plurality of reset signals after a corresponding one of the multiple phases of the sampling clock transitions between the first logical value and the second logical value; and
    de-assert the corresponding reset signal before the corresponding one of the multiple phases transitions between the first logical value and the second logical value.

4. The interleaving structure of claim 3, wherein the assertion of the corresponding reset signal occurs after a transition of a sampling clock of a sub analog-to-digital converter toggles between the first logical value and the second logical value.

5. The interleaving structure of claim 1, wherein each of the plurality of switches is configured to reset a corresponding one of the plurality of selected analog inputs to a predetermined value to provide sampled analog inputs.

6. The interleaving structure of claim 5, wherein each of the plurality of switches is configured to toggle the corresponding one of the plurality of selected analog inputs to the first logical value or the second logical value in response to the reset signal to remove residual samples stored on the corresponding one of the plurality of selected analog inputs.

7. The interleaving structure of claim 6, wherein each of the plurality of switches is configured to toggle the corresponding one of the plurality of selected analog inputs after a conversion from a first signal domain to a second signal domain.

8. The interleaving structure of claim 1, wherein the sample selector comprises:
    a second plurality of switches, each switch of the second plurality of switches being configured to be activated based on the multiple phases of the sampling clock.

9. A system for time interleaving sampling signals, comprising:
    a sample selector configured to sample an analog input based on multiple phases of a sampling clock to separate the analog input into a plurality of selected analog inputs;
    a clock generation circuit configured to provide the multiple phases of the sampling clock and to generate a plurality of reset signals;

a plurality of switches configured to toggle the plurality of selected analog inputs between a first logical value and a second logical value in response to the plurality of reset signals to provide a plurality of sampled analog inputs; and a plurality of sub analog-to-digital converters (sub-ADCs) configured to convert the plurality of sampled analog inputs from a first signal domain to a second signal domain.

10. The system of claim 9, wherein each of the multiple phases of the sampling clock switches between the first logical value and the second logical value, and wherein the sample selector is further configured to sample the analog input when a corresponding phase from among the multiple phases of the sampling clock is at the second logical value to provide a corresponding selected analog input from among the plurality of selected analog inputs.

11. The system of claim 9, wherein the clock generation circuit is further configured to:

assert a corresponding reset signal from among the plurality of reset signals after a corresponding one of the multiple phases of the sampling clock transitions between the first logical value and the second logical value; and de-assert the corresponding reset signal before the corresponding one of the multiple phases transitions between the first logical value and the second logical value.

12. The system of claim 11, wherein the assertion of the corresponding reset signal occurs after a transition of a sampling clock of a sub-ADC of the plurality of sub-ADCs toggles between the first logical value and the second logical value.

13. The system of claim 9, wherein each of the plurality of switches is configured to reset a corresponding one of the plurality of selected analog inputs to a known value to provide sampled analog inputs.

14. The system of claim 13, wherein each of the plurality of switches is configured to toggle the corresponding one of the plurality of selected analog inputs between the first logical value and the second logical value in response to a corresponding one of the plurality of reset signals to remove residual samples stored on the corresponding one of the plurality of selected analog inputs.

15. The system of claim 14, wherein each of the plurality of switches is configured to toggle the corresponding one of the plurality of selected analog inputs after a conversion from a first signal domain to a second signal domain.

16. The system of claim 9, wherein the sample selector comprises:

a second plurality of switches, each switch of the second plurality of switches being configured to be activated based on the multiple phases of the sampling clock.

17. An interleaving structure, comprising:

a first buffer configured to amplify an analog input;

a sample selector configured to sample the analog input based on multiple phases of a sampling clock to separate the analog input into a plurality of selected analog inputs;

a clock generation circuit configured to provide the multiple phases of the sampling clock to the sample selector and to generate a plurality of reset signals;

a plurality of switches configured to toggle the plurality of selected analog inputs between a first logical value and a second logical value in response to the plurality of reset signals to provide a plurality of sampled analog inputs;

a plurality of second buffers, each buffer of the plurality of second buffers being configured to amplify a corresponding one of the plurality of sampled analog inputs to generate amplified sampled analog inputs; and a plurality of sub-analog to digital converters (sub-ADCs), each sub-ADC of the plurality of sub-ADCs configured to convert a corresponding one of the plurality of sampled analog inputs from a first signal domain to a second signal domain.

18. The interleaving structure of claim 17, wherein the clock generation circuit is further configured to:

assert a corresponding reset signal from among the plurality of reset signals after a corresponding one of the multiple phases of the sampling clock transitions between the first logical value and the second logical value; and de-assert the corresponding reset signal before the corresponding one of the multiple phases transitions between the first logical value and the second logical value.

19. The interleaving structure of claim 18, wherein the assertion of the corresponding reset signal occurs after a transition of a sampling clock of a corresponding sub-ADC of the plurality of sub-ADCs toggles between the first logical value and the second logical value.

20. The interleaving structure of claim 19, wherein each of the plurality of switches is configured to toggle the corresponding one of the plurality of selected analog inputs between the first logical value and the second logical value in response to the corresponding reset signal to remove residual samples stored on the corresponding one of the plurality of selected analog inputs.

* * * * *